(12) United States Patent
Zojer (10) Patent No.: US 9,350,342 B2
(45) Date of Patent: May 24, 2016

(54) SYSTEM AND METHOD FOR GENERATING AN AUXILIARY VOLTAGE

(71) Applicant: Infineon Technologies Austria AG, Villach (AT)

(72) Inventor: Bernhard Zojer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 68 days.

(21) Appl. No.: 14/473,377

(22) Filed: Aug. 29, 2014

(65) Prior Publication Data

US 2016/0065204 A1 Mar. 3, 2016

(51) Int. Cl.
| | |
|---|---|
| H03B 1/00 | (2006.01) |
| H03K 3/00 | (2006.01) |
| H03K 17/687 | (2006.01) |
| H03K 17/13 | (2006.01) |
| H03K 19/0175 | (2006.01) |

(52) U.S. Cl.
CPC ............ *H03K 17/687* (2013.01); *H03K 17/133* (2013.01); *H03K 19/017509* (2013.01)

(58) Field of Classification Search
CPC ............................... H03K 17/16; H03K 3/012
USPC ................. 327/108–112, 427, 434, 430, 437, 327/141–143; 326/82, 83
See application file for complete search history.

(56) References Cited

U.S. PATENT DOCUMENTS

| | | | |
|---|---|---|---|
| 5,285,369 A | 2/1994 | Balakrishnan | |
| 5,892,389 A * | 4/1999 | Lai | H01H 47/325 323/277 |
| 7,245,175 B2 * | 7/2007 | Morita | H03K 17/6871 327/427 |
| 7,408,399 B2 | 8/2008 | Salato et al. | |
| 7,557,637 B2 * | 7/2009 | Sakamoto | H03K 17/063 327/109 |
| 7,777,553 B2 | 8/2010 | Friedrichs | |
| 8,228,113 B2 * | 7/2012 | Domes | H01L 24/49 327/427 |
| 8,487,667 B2 * | 7/2013 | Iwamura | H03K 17/567 327/108 |
| 2009/0009232 A1 * | 1/2009 | Helfrich | H03K 17/08142 327/430 |
| 2012/0133420 A1 * | 5/2012 | Draxelmayr | H02M 3/337 327/430 |
| 2014/0049296 A1 * | 2/2014 | Jeon | H03K 3/012 327/109 |

FOREIGN PATENT DOCUMENTS

DE 102010027832 B3 7/2011

\* cited by examiner

*Primary Examiner* — Lincoln Donovan
*Assistant Examiner* — Thomas Skibinski
(74) *Attorney, Agent, or Firm* — Slater Matsil, LLP (57) ABSTRACT

In accordance with an embodiment, a circuit includes a first normally-on transistor having a drain coupled to a first switching output node, a normally-off transistor having a drain coupled to a source of the first normally-on transistor, a driver circuit configured to receive a switching signal, the driver circuit having an output coupled to a gate of the first normally-on transistor, and a second normally-on transistor having a drain terminal coupled to a supply node, a gate terminal coupled to the output of the driver circuit, and a source terminal configured to provide an auxiliary voltage.

20 Claims, 5 Drawing Sheets

PRIOR ART

*FIG. 1a*

PRIOR ART

*FIG. 1b*

PRIOR ART

FIG. 4

SYSTEM AND METHOD FOR GENERATING AN AUXILIARY VOLTAGE

CROSS-REFERENCE TO RELATED APPLICATIONS

This application relates to the following co-pending and commonly assigned patent applications: U.S. patent application Ser. No. 14/473,300 filed on Aug. 29, 2014; and U.S. patent application Ser. No. 14/473,207 filed on Aug. 29, 2014, which applications are incorporated herein by reference in their entirety.

TECHNICAL FIELD

The present disclosure relates generally to an electronic device, and more particularly to a system and method for generating an auxiliary voltage.

BACKGROUND

High voltage switching transistors, such as power MOSFETs, junction field effect transistor (JFETs) and gallium nitride (GaN) high electron mobility transistor (HEMT), are commonly used as semiconductor switches in high voltage and high power devices such as switched-mode power supplies, motor controllers, and high voltage and high power switching circuits. Some of these devices, such as the GaN HEMT have the ability to be operated at very high voltages without the device breaking down or becoming damaged.

Some devices, such as the JFET and the GaN HEMT may be fabricated to have a negative threshold voltage, thereby causing the device to be conductive when zero voltage is across the gate and source of these transistors. Such devices are accordingly referred to as "normally-on" devices or transistors, since the devices are effectively on under zero bias conditions. When using such normally-on devices, provisions are generally made to ensure that a voltage is generated to make sure that the normally-on device may be turned off. For example, in a driver circuit used in a switch mode power supply, a negative voltage is generated or provided that has a voltage that is sufficiently below the threshold of the normally-on device to ensure that the device is in fact turned off as intended.

Another issue pertaining to using normally-on devices is the possibility of high current transients during the startup of a system in which normally-on devices are used. For example, if a normally-on device is coupled between the terminals of a high voltage power supply, large currents may result when power is applied to the system. In order to avoid these high startup currents, a normally-off device, such as an enhancement-mode MOSFET may be coupled in series with the normally-on device. Once the power supplies that are configured to provide the turn-off voltage to the normally-on device have attained a voltage sufficient to turn off the normally-on device, then the normally-off device may be turned on.

In some cases, however, the sequencing of the system during power up utilizes various circuits to control the timing and behavior of the system as power is being applied. In such cases, an auxiliary power supply may be used to provide power to the startup circuitry.

SUMMARY OF THE INVENTION

In accordance with an embodiment, a circuit includes a first normally-on transistor having a drain coupled to a first switching output node, a normally-off transistor having a drain coupled to a source of the first normally-on transistor, a driver circuit configured to receive a switching signal, the driver circuit having an output coupled to a gate of the first normally-on transistor, and a second normally-on transistor having a drain terminal coupled to a supply node, a gate terminal coupled to the output of the driver circuit, and a source terminal configured to provide an auxiliary voltage.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for providing an auxiliary supply voltage in a switching circuit. Embodiments of the present invention may also be applied, for example, to various systems that utilize auxiliary power supplies in the context of switching circuits, such as switched-mode power supplies, motor controller circuits, high voltage systems, as well as other circuits and systems.

In an embodiment, an auxiliary voltage is generated using a normally-on transistor having a drain coupled to a main supply voltage and a gate coupled to a switching signal. The auxiliary voltage is output at the source of the normally-on transistor and may be filtered using a capacitor. In some embodiments, the gate of the normally-on transistor is further coupled to a gate of a second normally-on transistor that is used for a switching function in a circuit. For example, this second normally-on transistor may be coupled to an inductor in a switched mode power supply and be configured to magnetize and demagnetize the inductor.

Certain types of power transistors, such the junction field effect transistor (JFETs) and gallium nitride (GaN) high electron mobility transistor (HEMT) behave as "normally-on" devices in that they are in a conductive state when zero volts is applied between the gate and source of the transistor. In order to switch these transistors off, a sufficiently high negative gate voltage is applied between the gate and the source of the transistor. For example, in the case of a GaN HEMT, this reverse voltage may be between about −5 V and about −8 V; however, turn off voltages outside of this range may also occur in some devices. Accordingly, in some systems, such as those that utilize charge pumps to develop negative bias voltages, there is a risk that the normally-on device may cause a short circuit between the power supply rails of the device before the charge pump has sufficient time to produce a sufficiently high negative voltage to turn off the normally-on device. Moreover, there is also a risk of short circuits during various fault conditions.

Figure 1A:
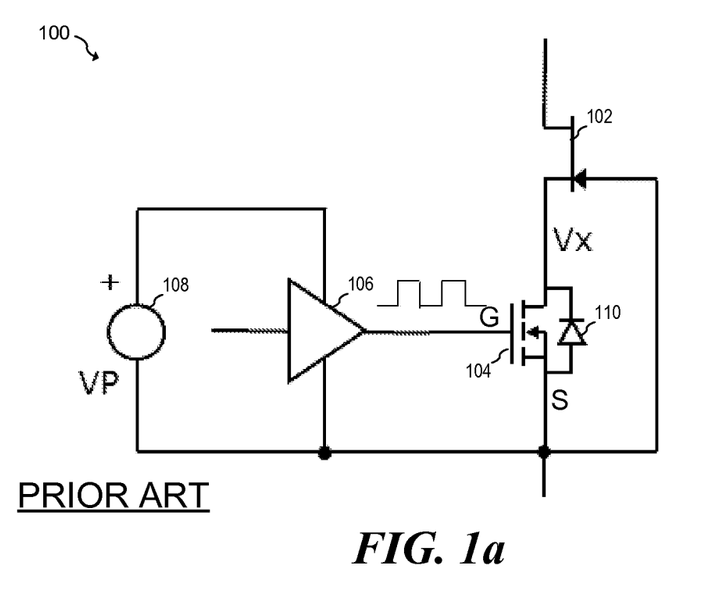
FIGS. 1a-1c illustrate conventional switch driving systems and auxiliary voltage generators.

One way in which this issue has been dealt with is by coupling the normally-on device in series with a normally-off device such as an enhancement mode MOSFET device in a cascode configuration, as illustrated in FIG. 1a. As shown, the source of the normally-on transistor 102 is coupled to the drain of the normally-off transistor 104 at node Vx, and the gate G of the normally-off transistor 104 is driven by driver circuit 106. Diode 110 represents the body diode of normally-off transistor 104.

Here, the gate G of the normally-off transistor 104 acts as the control terminal that is driven by driver circuit 106, whereas the gate of normally-on transistor 102 is connected to the source S of normally-off transistor 104. During startup, the series combination of the normally-on device and the normally-off device is non-conductive. Once the requisite supply voltage becomes available, the normally-off device may be driven with an input signal, such that the normally-on device functions as a cascode device. If the current flow through the switch is forced in the reverse direction, the body diode BD of normally-off transistor 104 becomes forward biased.

Voltage source 108, having a voltage VP, provides power to driver circuit 106. Thus, when the output of driver circuit 106 is high, a voltage of approximately VP may be provided to the gate of normally-off transistor 104. On the other hand, when the output of driver circuit 106 is low, zero volts are provided between the gate and source of transistor 104, thereby turning off normally-off transistor 104.

Figure 1B:
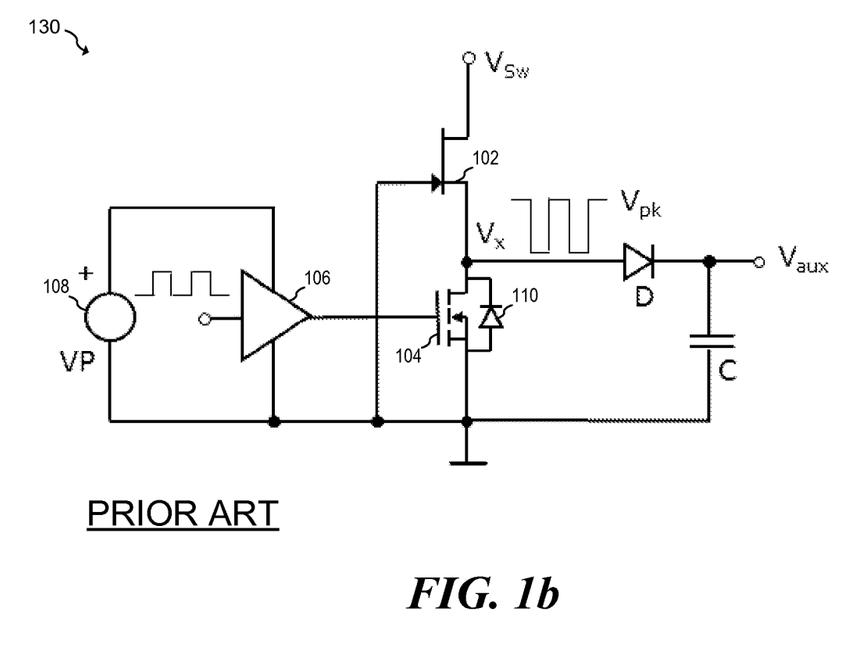

FIG. 1b illustrates a conventional switching circuit 130 in which source node Vx of normally-on transistor 102 is coupled to diode D and capacitor C. During operation, source node Vx of normally-on transistor 102 transitions between ground potential and a peak voltage Vpk that is higher than −Vth, the inverse of the threshold voltage of normally-on transistor 102. For example if the threshold of normally-on transistor 102 is −5 V, the peak voltage Vpk of source node Vx is higher than +5 V. The actual value of Vx depends on switching dynamics and can be significantly higher than −Vth (e.g. 20V). Diode D rectifies the voltage at source node Vx and capacitor C filters the voltage ripple at the output of diode D. Diode D further prevents capacitor C from being discharged when normally-off transistor 104 is turned on. Accordingly, an auxiliary voltage at output Vaux is provided that may be used to power driver circuit 106 during startup of the circuit and/or during periods of time in which voltage source 108 is unable to provide an adequate voltage potential to switch normally-off transistor 104.

Auxiliary voltage Vaux is dependent on a number of factors including the threshold voltage of transistor 102, switching dynamics, the diode voltage of diode D, circuit parasitics and other factors.

Figure 1C:
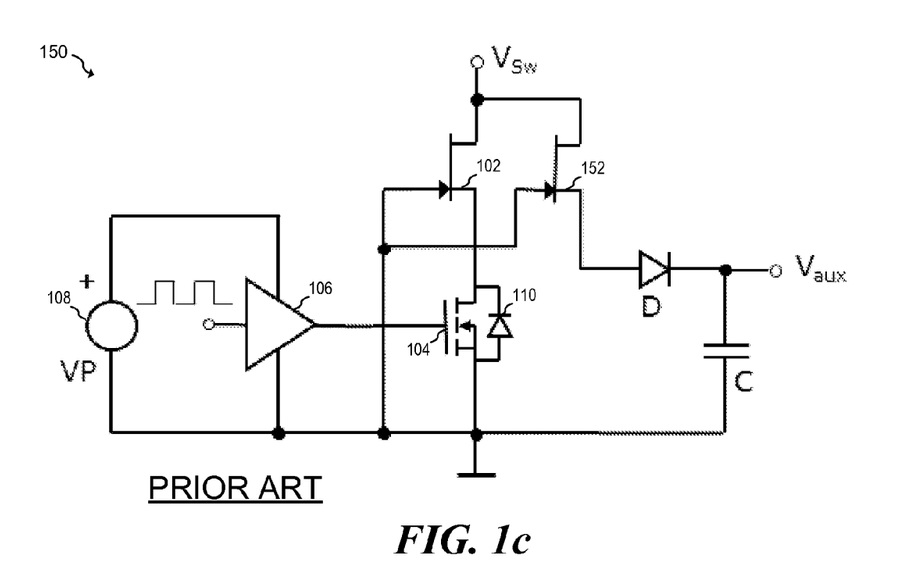

FIG. 1c illustrates switching circuit 150 in which the auxiliary voltage is taken from a source of a second normally-on transistor 152 that shares a drain node and a gate node with normally-on transistor 102. Transistor 152 is usually realized by separating the source connection of a small part of the large power transistor 102 and make it electrically accessible. Transistors 102 and 152 may be referred to as a "split transistor cell." Switching circuit 130 has less variation than switching circuit 130 of FIG. 1b because the source potential of transistor 152 is not switched and stays close to −Vth.

Figure 2:
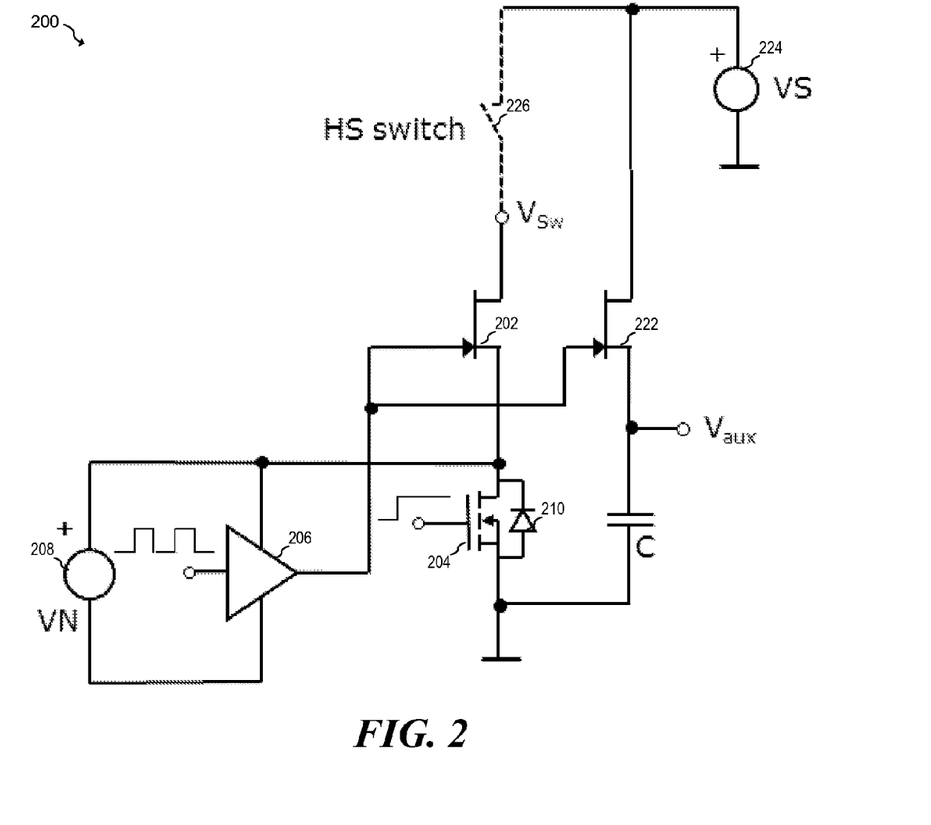
FIG. 2 illustrates an embodiment switch driving system with an auxiliary voltage generator.

FIG. 2 illustrates switching circuit 200 according to an embodiment of the present invention in which normally-on transistor 222 again produces auxiliary voltage Vaux directly at its source. Switching circuit 200 includes voltage source 208, driver circuit 206, normally-off transistor 204, and normally-on transistor 202 having its gate coupled to the output of driver circuit 206. Thus power transistor 202 is operated in a "directly driven" configuration whereas in the circuits of FIG. 1 the gate of power transistor 102 is at a fixed potential such that they are operated in a "cascode" configuration. Diode 210 represents the body diode of normally-off transistor 204. Normally-on transistor 222 further has its gate coupled to the output of driver circuit 206 and its source connected to capacitor C to produce auxiliary voltage Vaux. As shown in the illustrated embodiment, the drains of normally-on transistors 202 and 222 are connected to separate nodes: the drain of normally-on transistor 202 is connected to switch 226 and the drain of normally-on transistor 222 is connected to voltage source 224. Switch 226 is representative of various circuitry, such as switches, that may be coupled to the drain of normally-on transistor 202. In some embodiments, inductors, capacitors, resistors, diodes, transistors and other components may be coupled to the drain of normally-on transistor 202. For example, the circuitry coupled to the drain of normally-on transistor 202 may be circuitry used to implement a switched-mode power supply or a motor controller.

By coupling the drain of normally-on transistor 202 to various circuits within the application circuit while coupling the drain of normally-on transistor 222 to voltage source 224, auxiliary voltage Vaux may be kept relatively constant and about equal to the negative threshold voltage −Vth of normally-on transistor 222 without the need for a diode as in FIG. 1. In the present embodiment, Vaux may be used for example to supply the gate driver of transistor 204, which is on in normal operation. Driving its gate thus consumes very little power.

In an embodiment, Vaux may be used, for example to provide power to start-up circuitry and/or to provide a reference voltage based on a threshold of the normally-on transistor. For example, embodiments of the present invention may be used to provide a voltage related to the threshold of the normally-on transistor. This voltage may be used to bias a switching signal that has a common mode voltage that is at about the threshold voltage of the normally-on transistor 202. Such a system is described, for example, in co-pending U.S. patent application Ser. No. 14/473,300 filed on Aug. 29, 2014.

Normally-on transistors 202 and 222 may be implemented, for example, using GaN HEMT transistors. GaN HEMT transistors are basically structures with lateral current flow. Therefore, both source and drain connections are available at the semiconductor surface. A split transistor cell with separate source and drain connections can thus be easily formed within a single die. This is in contrast to common power MOSFET structures that utilize vertical current flow with the drain electrode formed by the chip substrate, and does not allow a split transistor structure with a separated drain. In embodiments utilizing GaN HEMT transistors, Vaux may range in value according to the variation of the threshold of the particular GaN transistor being used. For example, in one embodiment, the value of Vaux may range in voltage between about 5 V and about 9 V, which corresponds to a range in threshold voltage values of between about −5 V and about −9 V. Alternatively, values outside of this range may also be achievable depending on the particular semiconductor process and device geometry. In alternative embodiments, other transistor types, such as a power MOSFET transistor, a GaN HEMT, a JFET, an enhancement-mode MOSFET, a depletion-mode MOSFET, a bipolar junction transistor (BJT) or another transistor type may be used.

Figure 3:
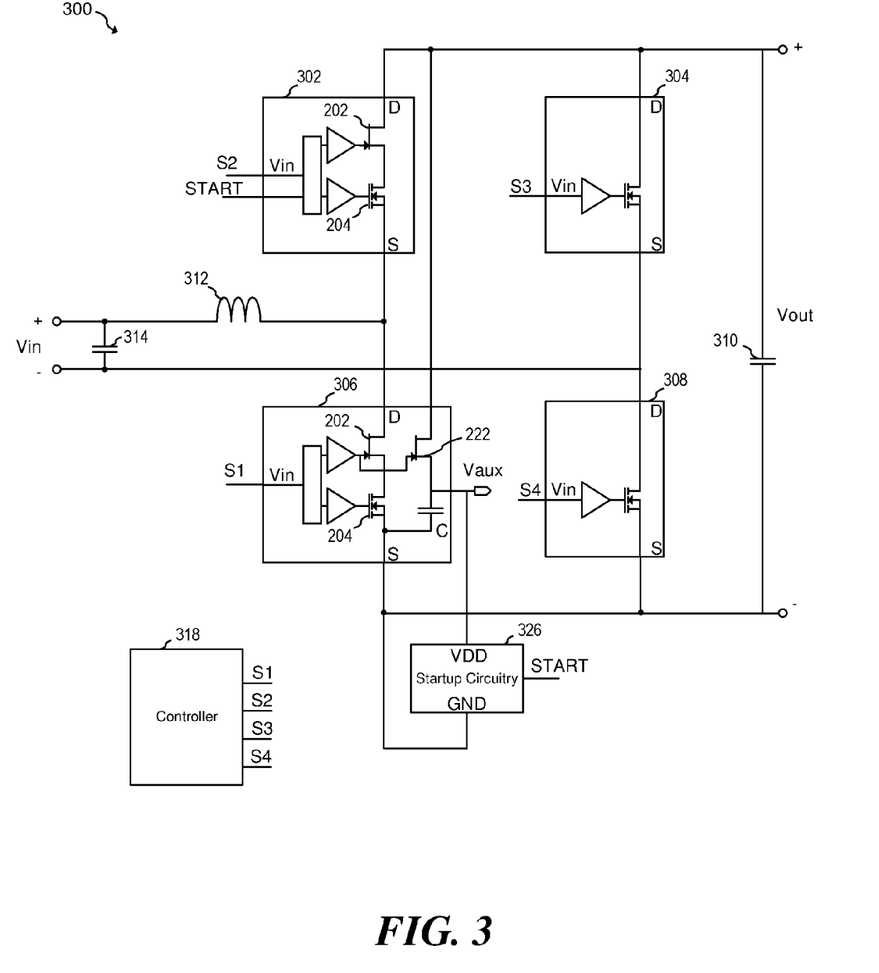
FIG. 3 illustrates an embodiment switched-mode power supply.

FIG. 3 illustrates switched-mode power converter 300 according to an embodiment of the present invention that is configured to convert an AC input signal, such as a 50 Hz to 60 Hz line voltage at input port Vin to a DC output voltage at output port Vout. For example, in one embodiment, switched-mode power converter 300 is configured to convert a 120 VAC or 240 VAC input 50 Hz to 60 Hz power line input voltage to a DC output voltage of about 400 V. Alternatively, other input voltages operated at the same or different frequency ranges may be used.

Switched-mode power converter 300 utilizes at least one embodiment compound switch driver 306 having normally-on transistor 202, normally-off transistor 204, normally-on transistor 222 and associated driver and control circuits. Normally-on transistor is coupled to positive output node and generates auxiliary voltage Vaux according to embodiments described above. As shown, voltage Vaux is used to provide power to startup circuitry 326.

Switched-mode power converter 300 includes an H-bridge implemented using embodiment compound switch and drivers 302 and 306 that include a normally-on transistor 202 coupled in series with a normally-off transistor 204, along with associated drivers and a control circuit. Switching circuits 304 and 308 that include MOSFET switching transistors are operated as synchronous rectifiers that provide a return current path and may also be implemented using diodes in some embodiments. This H-bridge is coupled to input port Vin via inductor 312. During operation of switched-mode power converter 300, compound switch and drivers 302 and 306, as well as switching circuits 304 and 308 magnetize and demagnetize inductor 312 such that power is transferred from input port Vin to output port Vout.

Each compound switch and driver 302 and 306 may be operated as cascode devices in which the normally-off transistor 204 is switched according to input switching signal Vin, and/or may be operated as direct drive devices in which the normally-off transistor 204 is turned on and the switching signal is applied to the gate of the normally-on transistor 202. Compound switch and driver 306 includes normally-on transistor 202, as well as normally-on transistor 222 that is used to provide auxiliary voltage Vaux as described in embodiments above. The control of the series normally-on transistors and normally-off transistors in compound switch and drivers 302 and 306, switching circuits 304 and 308, as well as the associated circuitry may be configured and operated as described in co-pending U.S. patent application Ser. No. 14/473,300 filed on Aug. 29, 2014. In alternative embodiments, compound switch and drivers 302 may be implemented using a single switching transistor and/or normally-off transistor 204.

Capacitor 314 represents the input capacitance of switched-mode power converter 300 and capacitor 310 represents the load capacitance of switched-mode power converter 300. In an embodiment, controller 318 provides switching signals to embodiment in compound switch and drivers 302 and 306, switching circuits 304 and 308, the timing of which are configured to convert an AC input signal at input port Vin to a DC output signal at port Vout. In some embodiments, signals S1 and S2 are non-overlapping switching signals in order to avoid current shoot through. Controller 318 may be implemented using an H-bridge-based switched mode power controller known in the art. In some embodiments, controller 318 may utilize current and/or voltage feedback from various nodes and current branches of switched-mode power converter 300 in order to provide feedback control of the output voltage, output current, and/or input currents. For example, the switching of signals S1 and S2 coupled to compound switch and drivers 302 and 306, respectively may be configured to provide a controlled output voltage and a controlled input current such that power factor correction is achieved.

Startup-circuitry 326 may be used to control the state of the normally-off transistor during startup via signal START. For example, normally-off transistor 204 may be kept off during startup until a bias generator that provides the turn-off voltage for normally-on transistors 202 has reached a voltage that can safely turn off normally-on transistors 202. Startup circuitry 326 may include logic circuitry and supply sensing circuitry known in the art used to implement, for example, under voltage lockout functions. In further embodiments, Vaux may be used to provide power to other circuit functions.

Figure 4:
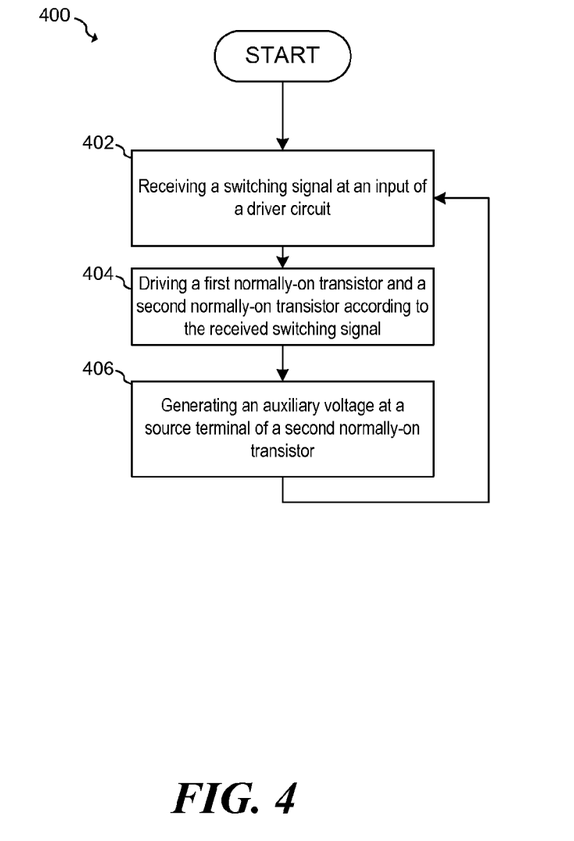
FIG. 4 illustrates a flowchart of an embodiment method.

FIG. 4 illustrates a flowchart of an embodiment method 400 of operating a switching circuit that includes a first normally-on transistor having a drain terminal coupled to a first switching output node, a normally-off transistor having a drain terminal coupled to a source terminal of the first normally-on transistor, a driver circuit having an output coupled to a gate terminal of the first normally-on transistor, a second normally-on transistor having a drain terminal coupled to a supply node and a gate terminal coupled to the output of the driver circuit. This method maybe used, for example, in conjunction with various illustrated embodiments disclosed herein. In an embodiment, a switching signal is received at an input of the driver circuit in step 402. The first normally-on transistor and the second normally-on transistor are driven according to the received switching signal in step 404, and an auxiliary voltage is generated at a source terminal of the second normally-on transistor in step 406.

In accordance with an embodiment, a circuit includes a first normally-on transistor having a drain coupled to a first switching output node, a normally-off transistor having a drain coupled to a source of the first normally-on transistor, a driver circuit configured to receive a switching signal, the driver circuit having an output coupled to a gate of the first normally-on transistor, and a second normally-on transistor having a drain terminal coupled to a supply node, a gate terminal coupled to the output of the driver circuit, and a source terminal configured to provide an auxiliary voltage. The circuit may further include a capacitor coupled between the source of the second normally-on transistor and a source of the normally-off transistor.

In an embodiment, the driver circuit further includes a first power supply terminal coupled to a source of the first normally-on transistor, and a second power supply terminal configured to be coupled to a driver reference voltage node. The circuit may also include a power supply circuit coupled between the first power supply terminal of the driver circuit and the second power supply terminal of the driver circuit. In some embodiments, the normally-off transistor is configured to be coupled to ground.

In an embodiment, the circuit further includes a switch coupled between the supply node and the switching output node, the supply node is configured to have a voltage of at least 100 V, and/or normally-on transistor is implemented using a gallium nitride (GaN) high electron mobility transistor (HEMT). In some embodiments, the normally-off transistor is implemented using an enhancement mode MOSFET device, the first normally-on transistor and the second normally-on transistor are disposed on a same semiconductor substrate and/or the auxiliary voltage is coupled to startup circuitry.

In accordance with a further embodiment, a switching circuit includes a first normally-on transistor having a drain terminal coupled to a first switching output node, a normally-off transistor having a drain terminal coupled to a source terminal of the first normally-on transistor, a driver circuit having an output coupled to a gate terminal of the first normally-on transistor, a second normally-on transistor having a drain terminal coupled to a supply node and a gate terminal coupled to the output of the driver circuit. A method of operating this circuit includes receiving a switching signal at an input of the driver circuit, driving the first normally-on transistor and the second normally-on transistor with the driver circuit according to the received switching signal, and generating an auxiliary voltage at a source terminal of the second normally-on transistor.

The method may further include low pass filtering the auxiliary voltage using a capacitor coupled between the source terminal of the second normally-on transistor and a source terminal of the normally-off transistor. The method may also include turning on the normally-off transistor, and may include turning on and turning off a switch coupled between the first switching output node and the supply node. In some embodiments, the normally-on transistor includes a gallium nitride (GaN) high electron mobility transistor (HEMT). The method may further include providing the auxiliary voltage to a startup circuit.

In accordance with a further embodiment, a power supply system includes a first switching circuit having a driver and a switch, such that the driver of the first switching circuit is coupled to a first power supply. The power supply system also includes a second switching circuit coupled in series with the first switching circuit. The first switching circuit includes a first normally-on transistor having a drain coupled to a first switching output node, a normally-off transistor having a drain coupled to a source of the first normally-on transistor, a driver circuit configured to receive a switching signal that has an output coupled to a gate of the first normally-on transistor, and a second normally-on transistor having a drain terminal coupled to a supply node, a gate terminal coupled to the output of the driver circuit, and a source terminal coupled to an auxiliary voltage node. The power supply system also includes a power-on circuit having a power supply coupled to the auxiliary voltage node. The power-on circuit is configured to provide power to the driver of the first switching circuit when a voltage of the first power supply is below a first threshold.

In an embodiment, the power supply system also includes an inductor coupled between a first AC input terminal and a first input node between the first switching circuit and the second switching circuit. In some embodiments, the normally-on transistor includes a gallium nitride (GaN) high electron mobility transistor (HEMT).

Advantages of some embodiments include the ability to generate a stable auxiliary voltage that may be used to provide power to a startup circuit. This auxiliary voltage may be used, for example, to generate a local supply for startup circuits and other circuitry, to provide a stable voltage based on a voltage threshold of a normally-on device.

A further advantage of embodiments include the ability to integrate supply generation for GaN HEMTs within the power transistor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A circuit comprising:
    a first normally-on transistor having a drain coupled to a first switching output node;
    a normally-off transistor having a drain coupled to a source of the first normally-on transistor;
    a driver circuit configured to receive a switching signal, the driver circuit having an output coupled to a gate of the first normally-on transistor; and
    a second normally-on transistor having a drain terminal coupled to a supply node, a gate terminal coupled to the output of the driver circuit, and a source terminal configured to provide an auxiliary voltage.

2. The circuit of claim 1, further comprising a capacitor coupled between the source of the second normally-on transistor and a source of the normally-off transistor.

3. The circuit of claim 1, wherein the driver circuit further comprises a first power supply terminal coupled to a source of the first normally-on transistor, and a second power supply terminal configured to be coupled to a driver reference voltage node.

4. The circuit of claim 3, further comprising a power supply circuit coupled between the first power supply terminal of the driver circuit and the second power supply terminal of the driver circuit.

5. The circuit of claim 4, wherein the source of the normally-off transistor is configured to be coupled to ground.

6. The circuit of claim 1, further comprising a switch coupled between the supply node and the first switching output node.

7. The circuit of claim 1, wherein the supply node is configured to have a voltage of at least 100 V.

8. The circuit of claim 1, wherein the first normally-on transistor and the second normally-on transistor comprise gallium nitride (GaN) high electron mobility transistors (HEMTs).

9. The circuit of claim 1, wherein the normally-off transistor comprises an enhancement mode MOSFET device.

10. The circuit of claim 1, wherein the first normally-on transistor and the second normally-on transistor are disposed on a same semiconductor substrate.

11. The circuit of claim 1, wherein the auxiliary voltage is coupled to startup circuitry.

12. A method of operating a switching circuit comprising a first normally-on transistor having a drain terminal coupled to a first switching output node, a normally-off transistor having a drain terminal coupled to a source terminal of the first normally-on transistor, a driver circuit having an output coupled to a gate terminal of the first normally-on transistor, a second normally-on transistor having a drain terminal coupled to a supply node and a gate terminal coupled to the output of the driver circuit, the method comprising:
    receiving a switching signal at an input of the driver circuit;
    driving the first normally-on transistor and the second normally-on transistor with the driver circuit according to the received switching signal; and
    generating an auxiliary voltage at a source terminal of the second normally-on transistor.

13. The method of claim 12, further comprising low pass filtering the auxiliary voltage using a capacitor coupled between the source terminal of the second normally-on transistor and a source terminal of the normally-off transistor.

14. The method of claim 12, further comprising turning on the normally-off transistor.

15. The method of claim 12, further comprising turning on and turning off a switch coupled between the first switching output node and the supply node.

16. The method of claim 12, wherein the first normally-on transistor and the second normally-on transistor comprise gallium nitride (GaN) high electron mobility transistors (HEMTs).

17. The method of claim 12, further comprising providing the auxiliary voltage to a startup circuit.

18. A power supply system comprising:
- a first switching circuit comprising a driver and a switch, wherein the driver of the first switching circuit is coupled to a first power supply;
- a second switching circuit coupled in series with the first switching circuit, wherein the first switching circuit comprises
  - a first normally-on transistor having a drain coupled to a first switching output node,
  - a normally-off transistor having a drain coupled to a source of the first normally-on transistor,
  - a driver circuit configured to receive a switching signal, the driver circuit having an output coupled to a gate of the first normally-on transistor, and
  - a second normally-on transistor having a drain terminal coupled to a supply node, a gate terminal coupled to the output of the driver circuit, and a source terminal coupled to an auxiliary voltage node; and
- a power-on circuit having a power supply coupled to the auxiliary voltage node, the power-on circuit configured to provide power to the driver of the first switching circuit when a voltage of the first power supply is below a first threshold.

19. The power supply of claim 18, further comprising an inductor coupled between a first AC input terminal and a first input node between the first switching circuit and the second switching circuit.

20. The power supply of claim 19, wherein the first normally-on transistor and the second normally-on transistor comprise gallium nitride (GaN) high electron mobility transistors (HEMTs).

* * * * *